United States Patent [19]

Colles

[11] Patent Number: 4,812,818
[45] Date of Patent: Mar. 14, 1989

[54] DIGITAL-TO-ANALOG CONVERTER

[75] Inventor: Joseph H. Colles, Oceanside, Calif.

[73] Assignee: Brooktree Corporation, San Diego, Calif.

[21] Appl. No.: 18,014

[22] Filed: Feb. 24, 1987

[51] Int. Cl.[4] .............................................. H03M 1/66
[52] U.S. Cl. ........................................ 371/30; 357/36; 341/118
[58] Field of Search ................... 340/347 DA, 347 M; 357/45, 36, 51

[56] References Cited

U.S. PATENT DOCUMENTS

| 3,995,304 | 11/1976 | Pease | 340/347 DA |
|---|---|---|---|
| 4,146,882 | 3/1979 | Hoff, Jr. et al. | 340/347 M |
| 4,336,528 | 6/1982 | Kane | 340/347 M |
| 4,658,240 | 4/1987 | Bixby | 340/347 DA |

OTHER PUBLICATIONS

All-Mos Charge Redist. A/D Conv. Techniques, McCreary and Gray; IEEE Journal of Solid State Circuits, Dec. 1975, pp. 371–379.

Primary Examiner—William M. Shoop, Jr.
Assistant Examiner—Richard K. Blum
Attorney, Agent, or Firm—Ellsworth R. Roston; Charles H. Schwartz

[57] ABSTRACT

An integrated circuit chip has circuitry for converting a binary coded value to an analog value. The chip includes first and second matrices each defined by rows and columns. The rows and columns have sources at different positions for producing currents in response to binary signals coding for the binary value. Each row in the first matrix is connected to a row in the second matrix on a reverse-image basis. For example, if each matrix has thirty two (32) rows, rows 1 and 32 in the first matrix are respectively connected to rows 32 and 1 in the second matrix. The rows in the matrices are sequentially selected in a pattern providing particular convergences and divergences of successive pairs of such rows in each matrix. Such sequential selection provides progressive convergences and then progressive divergences of the rows in each of the successive pairs in each matrix about the center line as a reference. Such progressive convergences and divergences may occur in at least a pair of successive cycles. When such a selection occurs, the selected rows in each matrix in one cycle are interleaved in such matrix with the selected rows in the other cycle. In this way, compensation may be provided on the chip for second order errors such as result from stresses in the chip.

16 Claims, 4 Drawing Sheets

FIG. 1
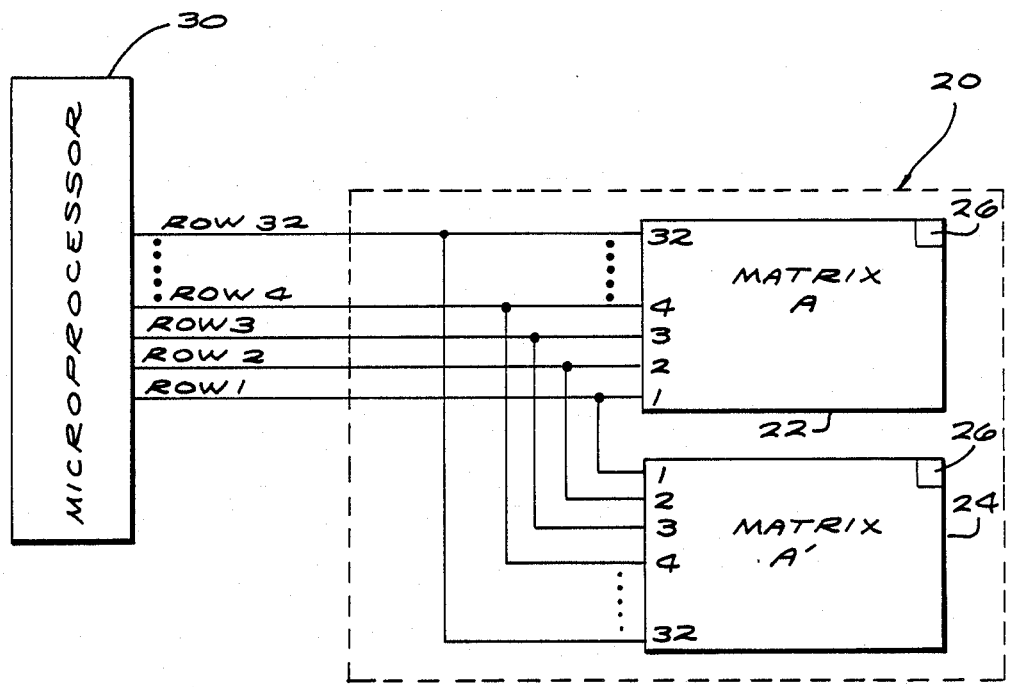
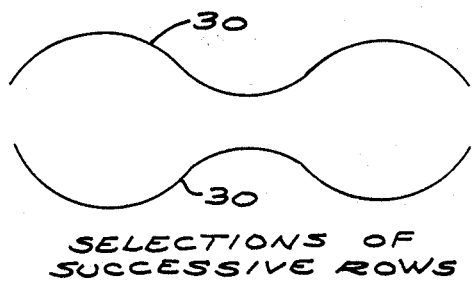
SELECTIONS OF
SUCCESSIVE ROWS
FIG. 3

FIG. 2

| Embodiment | Order |
|---|---|
| FIRST EMBODIMENT | 15, 20, 11, 24, 7, 28, 3, 32, 18, 13, 28, 9, 25, 5, 30, 1, 16, 19, 12, 23, 8, 27, 4, 31, 17, 14, 21, 10, 25, 6, 29, 2 |
| PRIOR ART EMBODIMENT | 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32 |
| SECOND EMBODIMENT | 17, 14, 21, 10, 25, 6, 29, 2, 18, 13, 22, 9, 26, 5, 30, 1, 16, 19, 12, 23, 8, 27, 4, 31, 15, 20, 11, 24, 7, 28, 3, 32 |
| THIRD EMBODIMENT | 18, 13, 22, 9, 26, 3, 30, 1, 17, 14, 21, 10, 25, 6, 29, 2, 15, 20, 11, 24, 7, 28, 3, 32, 16, 19, 12, 23, 8, 27, 4, 31 |
| FOURTH EMBODIMENT | 15, 20, 11, 24, 7, 28, 3, 32, 18, 13, 22, 9, 25, 5, 30, 1, 17, 14, 21, 10, 2, 5, 6, 29, 2, 16, 19, 12, 23, 8, 27, 4, 31 |
| FIFTH EMBODIMENT | 16, 19, 12, 23, 8, 27, 4, 31, 18, 13, 22, 9, 26, 5, 30, 1, 17, 14, 21, 10, 25, 6, 29, 2, 15, 20, 11, 24, 7, 28, 3, 32 |
| SIXTH EMBODIMENT | 17, 14, 21, 10, 25, 8, 29, 2, 18, 13, 22, 9, 26, 5, 30, 1, 15, 20, 11, 24, 7, 2, 8, 3, 32, 16, 19, 12, 23, 8, 27, 4, 31 |
| SEVENTH EMBODIMENT | 16, 19, 12, 23, 8, 27, 4, 31, 18, 13, 22, 9, 26, 5, 30, 1, 15, 20, 11, 24, 7, 28, 3, 32, 17, 14, 21, 10, 25, 6, 23, 2 |
| EIGHTH EMBODIMENT | 15, 20, 11, 24, 7, 28, 3, 32, 2, 29, 6, 25, 10, 21, 14, 17, 18, 13, 22, 9, 26, 5, 30, 1, 31, 4, 27, 8, 23, 12, 19, 16 |
| NINTH EMBODIMENT | 15, 20, 11, 24, 7, 28, 3, 32, 1, 30, 5, 26, 9, 22, 13, 18, 16, 19, 12, 23, 8, 27, 4, 31, 2, 29, 6, 25, 10, 21, 14, 17 |

ORDER OF SELECTING SUCCESSIVE ROWS FOR PROCESSING

DIGITAL-TO-ANALOG CONVERTER

This invention relates to apparatus for, and methods of converting binary coded values to analog values with minimal error. More particularly, the invention relates to apparatus for, and methods of, correcting in a digital-to-analog converter on an integrated circuit chip for second order errors such as result from stresses in the chip.

Various types of equipment receive information in analog form. Such equipment includes process control equipment, measuring instruments, communications equipment and a wide variety of other equipments. Digital computers and data processing systems often receive input parameters in analog form from such equipments and convert these parameters to digital form for processing in the computers or the data processing equipments. After the analog information has been converted to digital information and has been processed, the output information from the digital computers or the data processing equipments is often converted to an analog form. By converting the digital information to an analog form, the user can assimilate the information in ways which would be difficult if the information remained in digital form.

A good example of the conversions described in the previous paragraph is in the recording and reproduction of music. The music is produced in analog form. It is converted to digital form by recently developed data processing techniques and is recorded in digital form on a medium such as a tape or a disc. When the music is to be reproduced, it is converted again to analog form because this is the form which is necessary to operate sound transducers to give meaning to the listener when he hears the music.

As digital computers and data processing equipments have become widespread throughout industry and the office and have even become common in the home, the need for inexpensive, simple and reliable apparatus for converting information between digital and analog forms has become of increasing concern. A considerable effort has been devoted over a period of several decades to provide converting apparatus which is simple, inexpensive and reliable. In spite of such efforts, the converting apparatus now in use does not meet such criteria.

The converters now in use are generally disposed in an integrated circuit chip. The chips are fabricated such that a plurality of chips (or dies) are simultaneously fabricated on a wafer and are then separated from one another after such fabrication. Each die has a plurality of current sources which are selectively energized in accordance with the binary coded value being converted to the analog value.

The fabrication of the dies (or chips) on the wafer is obtained only after the performance on the wafer of a number of operations some of which are at relatively high temperatures. Such temperatures tend to produce stresses on the wafer. These stresses are so prevalent that they even affect the ability of the different current sources on each individual die to produce substantially the same current, when energized, as the other current sources on such die. As a result, second order errors are produced in the current sources in each die. These second order errors affect the ability of the converters formed on such chips (or dies) to provide an accurate conversion to an analog value of binary coded signals introduced to the converter.

Applicant does not believe that anyone prior to applicant has appreciated that second order errors occur in an integrated circuit chip from stresses produced in the chip during the fabrication of the wafer incorporating the chip. This is particularly true since integrated circuit chips now have an area as small as that defined by a dimension one quarter of one quarter of an inch ($\frac{1}{4}''$) on each side. Since no one has appreciated that such second order errors exist in integrated circuit chips, no one can has provided any effective way of compensating for such error. Furthermore, no one can have provided the particular techniques used by applicant to enhance the accuracy of a converter on an integrated circuit chip in converting a binary coded value to an analog value.

The converters now in use are generally disposed on an integrated circuit chip. The chips are fabricated such that a plurality of chips (or dies) are simultaneously fabricated on a wafer and are then separated after such fabrication. The fabrication of the dies on the wafer is obtained only after the performance of a number of operations some of which are at relatively high temperatures. Such temperatures tend to produce stresses in the wafer. These stresses tend to produce second order errors in the output currents produced from different current sources in the integrated circuit chip.

This invention provides a converter which overcomes second order errors such as result from stresses in an integrated circuit chip. The invention provides such compensation in a simple and reliable manner so that the second order errors are substantially eliminated with a minimal amount of additional circuitry on the integrated circuit chip.

In one embodiment of the invention, an integrated circuit chip has circuitry for converting a binary coded value to an analog value. The chip includes first and second matrices each defined by a plurality of rows and a plurality of columns. The rows and columns have sources at different positions for producing currents in response to binary signals coding for the binary value. Each row on the first matrix is connected to a row in the second matrix on a reverse-image basis. For example, if each matrix has thirty two (32) rows, rows 1 and 32 on the first matrix are respectively connected to rows 32 and 1 on the second matrix.

The rows on the first and second matrices are sequentially selected in a pattern providing particular convergences and divergences of successive pairs of such rows in each of such matrices about the center of the matrix as a reference. Such sequential selection provides for cyclic deviations between the rows in the successive pairs in each of the matrices, each progressive convergences and progressive divergences about the center line as a reference. Such cyclic deviations provide for progressive convergences and then divergences of the rows in each of the successive pairs in each of the matrices. Such progressive convergences and divergences may occur in at least a pair of cycles. When the selection occurs in at least a pair of successive cycles, the selected rows in each matrix in one of the cycles are interleaved with the selected rows in the matrix in the other cycle.

Upon the selection of each row in the first and second matrices, the different positions in the selected row may be. In this way, compensation may be provided on the chip for second order errors such as result from stresses in the chip.

In the drawings:

FIG. 1 is a perspective view of a converter on an integrated circuit chip for converting binary coded values to analog values and particularly illustrates a pair of matrices in the converter for minimizing second order errors from stresses in the chip;

FIG. 2 is a table illustrating the sequences in which the current sources in the different rows on the matrix are activated with progressive increases in the magnitude of a binary coded value to be converted to analog value;

FIG. 3 is a curve schematically illustrating how the differences in the relative dispositions of successive pairs of the rows in the sequences shown in FIG. 2 define cyclic relationship;

Figure 4:
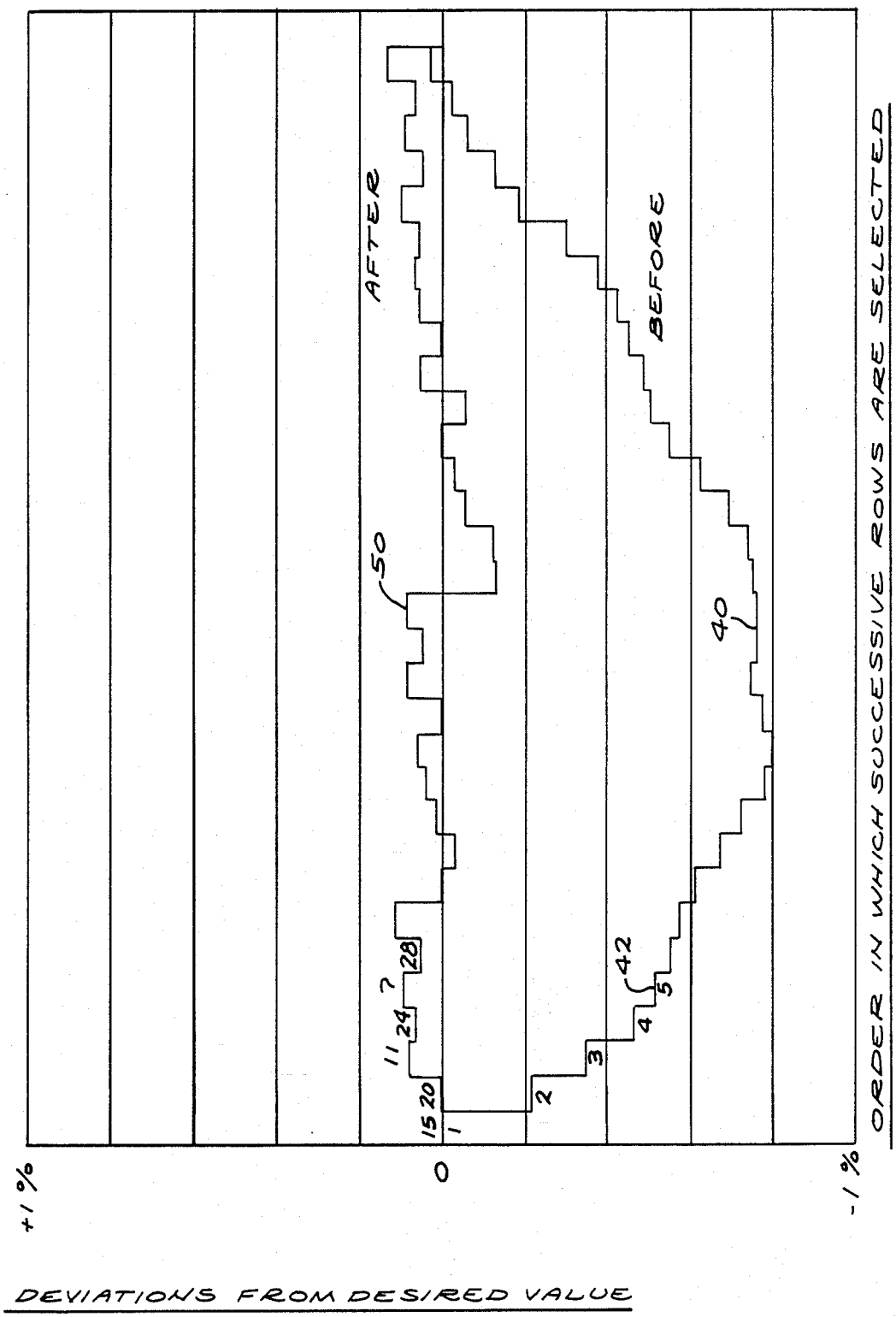
FIG. 4 shows curves which illustrate the relative deviations from a median value in a converter of the prior art and a converter included in a preferred embodiment of this invention.

In certain types of converters for converting binary coded values to analog values, a plurality of current sources 10 (FIG. 1) are disposed on an integrated chip, generally indicated at 12, in a matrix relationship defined by rows and columns. In a simple form of converter, each progressive one of the current sources 10 in the first row may be activated (as known in the prior art) for progressive increases in a binary coded value. After all of the current sources 10 in the first row have been activated, the current sources in the next row are progressively activated for progressive increases in the binary value. In this way, the current sources in the progressive rows are sequentially activated with progressive increases in the binary coded value. The currents in the activated current sources are then summed at each instant to provide a current with a magnitude indicative of the analog values at that instant.

A prior art converter constructed in accordance with the discussion in the previous paragraph is shown schematically in FIG. 2 and is designated in that Figure as "prior art converter". As shown in FIG. 2, the different rows of the current sources in such converter are designated by arabic numerals such as "1", "2" and "3". The sequence of activiating the prior art converter in the different rows is indicated by the sequence of the numbers in such converter in FIG. 2.

Although integrated circuit chips are quite small (e.g., ¼×¼" in area), it has been found that the characteristics of the current sources on the chip are not uniform. For example, the thickness of the layers of the semi-conductor material defining the different electrodes in the current sources have not been uniform. This non-uniformity has tended to vary with progressive positions along the area of the chips. These non-uniformities have affected the magnitudes of the currents produced by the current sources at different positions on the integrated circuit chip. These non-uniformities have caused differential errors to be produced in the chip with progressive increases in the binary coded value to be converted to the analog value.

Various improvements have been made in converters of the type discussed in the previous paragraph to reduce the differential non-linearities of such converters with progressive increases in the binary coded value. For example, two (2) United States patent applications assigned of record to the assignee of record of this application are effective in reducing the differential non-linearities of a converter disposed on an integrated circuit chip. One of these patent applications was filed in the United States Patent Office on May 7, 1984, in the name of James A. Bixby for "Apparatus for Converting Data Between Analog and Digital Values". The other patent application was filed in the United States Patent Office in the name of Lanny L. Lewyn for "New Centroiding Algorithm for Networks Used in A/D and D/A Converters". The first application discloses and claims a particular re-arrangement of the current sources on an integrated circuit chip for minimizing the effects of the differential non-linearities of the current sources on the chip. The second application discloses and claims a duplication of the current sources on a chip in a reverse-image arrangement to minimize differential non-linearities on the chip.

Applicant has found that there are, on an integrated circuit chip, second order errors resulting from stresses produced in the chip, particularly during the steps in which the integrated circuit chip is being treated at elevated temperatures. These stresses cause the current sources at different positions on the chip to produce deviations from a desired current even when the physical characteristics of these current sources, such as the layers of the materials defining the current sources, are substantially constant.

Figure 5A:
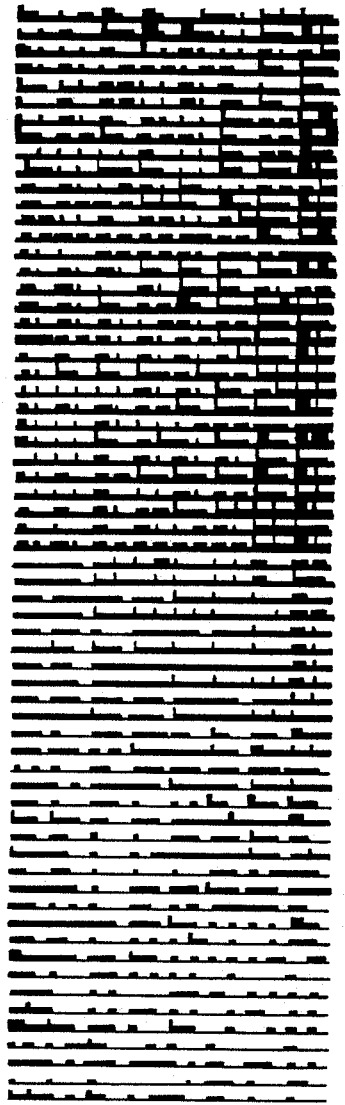
FIGS. 5a and 5b schematically illustrate the relative deviations from a median value of the currents produced in the current sources in each row in the converters of the prior art.

FIG. 5a illustrates the patterns of the currents produced by the current sources in the different rows of a converter of the prior art and by the individual currents in each row. The current sources in each individual row are indicated at a different heighth in FIG. 5a than the current sources in every other row. The different current sources in a row are indicated at progressive positions along the row in FIG. 5a. In FIG. 5a, currents produced in each current source in a row above a median value are indicated by a dark background and currents produced in each current source in a row below the median value are indicated by a light background.

Figure 5B:
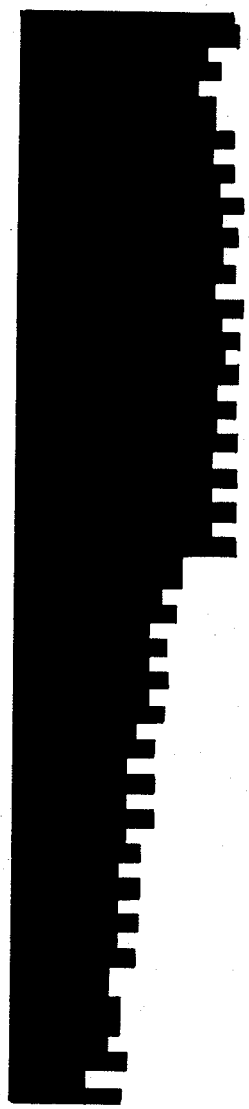

FIG. 5b illustrates the cumulative value of the current in each of the rows shown in FIG. 5a. In FIG. 5b, each of the different rows in the converter on the integrated circuit chip is at the same vertical position as the representation shown in FIG. 5a. As will be seen, the cumulative current in the current sources in each of the rows in the upper half of FIG. 5b deviate only slightly from a median position. However, the cumulative current in the current sources in each of the rows in the lower half of FIG. 5b deviate considerably from the median of the cumulative currents in the rows in the upper half of FIG. 5a. Furthermore, the cumulative current in the current sources in the rows in the lower half of FIG. 5b tend to decrease progressively with progressive positions downwardly in FIG. 5b.

FIGS. 5a and 5b represent measurements taken on an actual unit of an integrated circuit chip providing in the prior art a conversion between binary coded values and analog values. FIGS. 5a and 5b are only illustrative. An analysis of a number of other units has indicated similar problems. The patterns in these chips may not be identical to those shown in FIGS. 5a and 5b but they tend to show that there is a dissimilarity in the patterns of the cumulative currents in the rows on one half of the chip relative to the patterns of the cumulative currents in the rows on the other half of the chip. The dissimilarities in the patterns of the cumulative currents in the rows of the two (2) halves of the chips tend to result from stresses produced in the chip during the steps of fabricating the chips, particularly the steps involving heating the chip to high temperatures.

This invention provides a converter which overcomes the second order errors resulting from stresses in an integrated circuit chip on which the converter is formed. In one embodiment of the invention, an integrated circuit chip generally indicated in broken lines at 20 (FIG. 1) may be formed in a conventional sequence of steps to respond to a plurality of binary coded signals to be converted to an analog value.

The integrated circuit chip 20 includes a pair of matrices 22 (also designated as matrix A) and 24 (also designated as matrix B) on the chip. Each of the matrices 22 and 24 is formed from a plurality of current sources 26 (such as the current sources 10 in FIG. 1) disposed in rows and columns. For example, there may be thirty two (32) rows of current sources 26 in each of the matrices 22 and 24. These rows may be respectively designated as "1" through "32". Each of the rows may have a plurality of current sources 26 at progressive positions along the row. In this respect, each of the matrices 22 and 24 corresponds in general format to the matrix shown in FIG. 1 and described above.

The current sources 26 in each of the rows in the matrix 22 is connected on an inverse image basis to the current sources in one of the rows of the matrix 24. For example, the current sources 26 in the row 1 in the matrix 22 are connected to the current sources in the row 1 in the matrix 24. Similarly, the current sources 26 in the row 32 in the matrix 22 are connected to the current sources in the row 26 in the matrix 24. As will be seen, the row 1 is at the bottom of the matrix 22 and the top of the matrix 24. Similarly, the row 32 is at the top of the matrix 22 and at the bottom of the matrix 24.

The different rows in the matrices 22 and 24 are activated by a microprocessor 30 in a particular pattern to minimize second order errors resulting from stresses in the integrated circuit chip 20. When the microprocessor 30 activates a row in the matrix 22 and an inverse row in the matrix 24, the microprocessor may then select the different current sources 26 in the activated rows. Preferably the rows in each matrix are activated so that the differences (or spaces) between successive pairs of activated rows in such matrix have a cyclic relationship relative to the center of the matrix as a reference. For example, a preferred arrangement for activating progressive pairs of rows in the matrix 22 is shown as the first embodiment in FIG. 2. In the preferred arrangement, progressive pairs of rows in the matrix 22 are sequentially activated as follows: (1) 15 and 20, (2) 11 and 24, (3) 7 and 28 and (4) 3 and 32.

As will be seen, the rows 15 and 20 in the matrix 22 are disposed on the opposite sides of the center of the matrix as a reference. The rows 11 and 24, the rows 7 and 28 and the rows 3 and 32 are also disposed on opposite sides of the center of the matrix 22 as a reference. The rows 7 and 28 are further from the center of the matrix 22 than the rows 15 and 20, and the rows 3 and 32 are further from the center of the matrix 22 than the rows 7 and 28. Furthermore, the rows 5 and 20, the rows 11 and 24, the rows 7 and 28 and the rows 3 and 32 progressively deviate from the center of the matrix 22.

In each of the first pairs in the preferred embodiment of the invention, the first row in the pair has a lower number than the second row in the pair. However, in successive pairs of rows in the preferred embodiment, the first row in the pair has a higher number than the second row in the pair. This may be seen from the following progressive pairs of rows in the preferred embodiment: (5) 18 and 13, (6) 22 and 9, (7) 25 and 5 and (8) 30 and 1. The rows in each of the pairs (5), (6), (7) and (8) in each matrix are on opposite sides of the center of the matrix. The rows in the successive pairs (5), (6), (7) and (8) deviate progressively from the center of the matrix 22.

In the preferred embodiment, progressive pairs of rows are subsequently activated in a pattern similar to that discussed two paragraphs previously. These progressive pairs are as follows: (9) 16 and 19, (10) 12 and 23, (11) 8 and 27 and (12) 4 and 31. As will be seen, the rows in each of the pairs (9), (10), (11) and (12) in each matrix are on opposite sides of the center of the matrix. The rows in the successive pairs in each matrix deviate progressively from the center of the matrix. Furthermore, the rows in the pairs designated as (9), (10), (11) and (12) are respectively interleaved with the rows designated as (1), (2), (3) and (4).

Similarly, the remaining pairs of rows for each matrix in the preferred embodiment of the invention are respectively designated as (13) 17 and 14, (14) 21 and 10, (15) 25 and 6, and (16) 29 and 2. The rows in each of the pairs (13), (14), (15) and (16) for each matrix are disposed on opposite sides of the center of the matrix. The rows in each of the successive pairs (13), (14), (15) and (16) in each matrix deviate progressively from the center of the matrix. The rows in these remaining pairs in each matrix are respectively interleaved with the rows in the pairs defined as (5), (6), (7) and (8) for that matrix.

As will be seen from the progressive pairs of rows in the preferred embodiment and from the discussion above, the progressive pairs of rows in each matrix preferably have a converging or diverging pattern relative to the center of the matrix. This pattern may converge or diverge initially in a first direction relative to the center of each matrix such as a negative direction and then converge or diverse in an opposite direction such as a positive direction relative to the center or the matrix. Furthermore, this diverging or converging pattern is preferably cyclic or repetitive for each matrix as indicated at 30 in FIG. 3. When the pattern is cyclic or repetitive for each matrix, the progressive pairs of rows in one cycle or repetition for such matrix may be interleaved in the matrix with the progressive pairs of rows in another cycle or repetition.

FIG. 2 illustrates the patterns constituting other embodiments of this invention for sequentially activating pairs of rows on one of the matrices such as the matrix 22. Although these other embodiments provide results superior to those provided in the prior art, they do not appear to minimize second order errors with quite the same effectiveness as the preferred embodiment. However, each of these other embodiments is similar to the preferred embodiment in activating progressive pairs of rows in a particular pattern in each matrix and in providing the particular pattern with cyclic or repetitive characteristics relative to the center of the matrix as represented by an interleaved relationship between the progressive pairs in the different cycles or repetitions.

As will be appreciated, when each of the rows in each of the matrices 22 and 24 is activated, progressive ones of the current sources 26 in the activated row in such matrix is energized by the microprocessor 30 for progressive increases in the binary value coded by the binary signals. The particular pattern of energizing the different current sources 26 in the activated row in each matrix is not important in this invention. For example, the current sources 26 progressively disposed along the activated row in each of the matrices 22 and 24 may be sequentially activated by the microprocessor 30 for progressive increases in the binary value coded by the binary signals introduced to the converter.

FIG. 4 illustrates how the converter of this invention minimizes second order errors such as results from stresses in an integrated circuit chip. In FIG. 4, a curve 40 is included to show the deviations from a desired value (the zero axis in FIG. 4) in the cumulative current produced in each row in a converter of the prior art. In the curve 40, the progressive rows activated in the sequence are indicated by arabic numbers below the progressive increments in the curve. As will be seen in the curve 40, such a deviation is indicated for each row by a step such as a step 42 for the row 5. It will also be seen that the rows in the converter of the prior art are activated sequentially from row 1 to row 32. The area between the curve 40 and the zero (0) axis represents the cumulative deviation of the cumulative currents in the rows 1 through 32.

FIG. 4 also includes a curve 50 showing the deviations from a desired value when the matrices 20 and 22 are paired as shown in FIG. 1 and discussed above and when the rows in the matrix 22 are activated in a sequential pattern identified by the preferred embodiment in FIG. 2. This pattern is also indicated by arabic numerals above the successive steps or increments in the curve 50. As will be seen, the deviation from a desired value represented by the zero (0) axis are considerably reduced for each of the rows below the deviations for the different rows in the curve 40 for the converters of the prior art. It will be appreciated that the wire 50 represents the errors obtained in the matrices 22 and 24 by pairing the different rows in the matrices on a reverse-image basis as described in detail above.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination in an integrated circuit chip to correct for second order errors resulting from stresses in the integrated circuit chip,
   a first matrix disposed on the chip and containing a plurality of current sources in successive rows and columns,
   a second matrix disposed on the chip in spaced relationship to the first matrix and containing a plurality of current sources in successive rows and columns,
   means for providing for the simultaneous selection of the current sources in different rows in the first matrix and the current sources in different rows in the second matrix on an inverse basis to the rows in the first matrix, and
   means for providing for the sequential selection in each of the first and second matrices of pairs of the rows in a pattern providing progressive convergences an then divergences of the successive pairs of selected rows in each of such matrices relative to the center of such matrix.

2. In a combination as set forth in claim 1,
   the means for sequentially selecting the pairs of rows in the converging and then diverging patterns in each of the matrices providing for cyclic deviations in the spacing between the rows in the sequential pairs selected in such matrix.

3. In a combination as set forth in claim 1,
   the means for selecting the pairs of the rows in the converging and then diverging patterns in each of the matrices providing for a progressive convergence and then divergence of the sequential pairs of rows in such matrix in an interleaved relationship between such progressive convergences and then divergences of such pairs of rows in such matrix.

4. In a combination as set forth in claim 1,
   the selecting means providing sequentially for progressive convergences and then divergences of the selected pairs of rows in each of the matrices in at least a pair of cycles and providing for the selection of the successive pairs of rows in each of the matrices in one of the cycles in interleaved relationship with the selection of the successive pairs of rows in such matrix in the other cycle.

5. In combination in an integrated circuit chip for correcting for second order errors resulting from stresses in the integrated circuit chip,
   a first matrix disposed on the integrated circuit chip and having a plurality of current sources defined by a plurality of rows and a plurality of columns,
   a second matrix disposed on the integrated circuit chip in displaced relationship to the first matrix and having a plurality of current sources defined by a plurality of rows and a plurality of columns, and
   means for simultaneously energizing rows in the first and second matrices in each of the matrices, in a pattern in one of the matrices related to the pattern in the other one of the matrices, to compensate for the second order effects resulting from stresses in the integrated circuit chip, the row energized at each instant in the first matrix being different from, but related to, the row energized at that instant in the second matrix.

6. In a combination as set forth in claim 5,
   means for simultaneously energizing pairs of rows, one in the first matrix and the other in the second matrix, where the selected row in the first matrix has a position which is the inverse of the selected row in the second matrix.

7. In a combination as set forth in claim 5,
   means for sequentially energizing the rows in each of the first and second matrices in at least one cyclic pattern of progressive convergences and then divergences relative to the central row in such matrix as a reference, and
   means for energizing each of the positions in each of the selected rows in each of the first and second matrices at progressive instants of time.

8. In a combination as set forth in claim 7,
   means for simultaneously energizing pairs of rows, one in the first matrix and the other in the second matrix, where the selected row in the first matrix has a position which is the inverse of the selected row in the second matrix.

9. In combination in an integrated circuit chip for compensating for second order effects resulting from stresses in such integrated circuit chip,
- a first matrix disposed on the chip and having a plurality of current sources defined by a plurality of rows and a plurality of columns,
- a second matrix disposed on the chip in displaced relationship to the first matrix and having a plurality of current sources defined by a plurality of rows and a plurality of columns, and
- means for sequentially energizing pairs of rows in each of the first and second matrices in a pattern providing for selective differences between the sequential pairs of rows in such matrix to minimize in such matrix the second order effects resulting from the stresses in the integrated circuit chip.

10. In a combination as set forth in claim 9,
- the differences between the sequential pairs of the selected rows in each of the matrices having a pattern of convergence and then of divergence, the pairs of rows in one of the matrices being sequentially activated on an inverse basis relative to the activation of the pairs of rows in the other matrix.

11. In a combination as set forth in claim 10,
- the pattern of convergence and then of divergence in the difference between the sequential pairs of the selected rows in each of the matrices being cyclic.

12. In a combination as set forth in claim 10,
- the pattern of convergence and then of divergence in the difference between the sequential pairs of the selected rows in each of the matrices defining at least a pair of cycles and the rows defining one of the cycles being interleaved with the rows defining the other cycle.

13. A method of compensating in an integrated circuit chip for second order error resulting from stresses in the integrated circuit chip,
- providing first and second matrices on the integrated circuit chip, each of the matrices being displaced on the integrated circuit chip from the other matrix and having a plurality of positions defined by a plurality of rows and a plurality of columns,
- providing an electrical commonality between each of the rows in the first matrix and the row constituting the inverse image in the second matrix of each second row in the first matrix to obtain a simultaneous selection of the common rows in the first and second matrices, and
- sequentially selecting pairs of the rows in each of the first and second matrices in a cyclic pattern represented by the amount of separation between such rows in such pairs.

14. In a combination as set forth in claim 13,
- the sequential selection of the pairs of rows being provided for each matrix about a central row in such matrix as a reference.

15. In a combination as set forth in claim 14,
- the sequential selection of the pairs of rows being made in a pattern of convergence and then of divergence for each matrix to define a cyclic variation in the differences between such sequential selections of the pairs of rows in such matrix.

16. In a combination as set forth in claim 15,
- the sequential selection of the pairs of rows for each of the matrices being made in the pattern of convergence and then of divergence for such matrix to define at least two cycles in the difference between such sequential selection and the pairs of rows in one of the cycles being interleaved in each such matrix with the pairs of rows in the other cycle in such matrix.

* * * * *